United States Patent
Hsieh et al.

(10) Patent No.: US 6,489,227 B1
(45) Date of Patent: Dec. 3, 2002

(54) METHOD OF ETCHING A POLYSILICON LAYER DURING THE STRIPPING OF THE PHOTORESIST SHAPE USED AS AN ETCH MASK TO CREATE AN OPENING TO AN UNDERLYING FUSE STRUCTURE

(75) Inventors: Tsung-Chi Hsieh, Tamshui (TW); Yuan-Ko Hwang, Hualien (TW); Juei-Wen Lin, Taichung (TW); Kuei-Jen Chang, Hsing-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/917,303

(22) Filed: Jul. 30, 2001

(51) Int. Cl.$^7$ ................................................ H01L 21/44
(52) U.S. Cl. .................. 438/601; 438/132; 438/215; 438/622; 438/624; 438/634; 438/637
(58) Field of Search ................. 438/601, 132, 438/215, 637, 622, 624, 634

(56) References Cited

U.S. PATENT DOCUMENTS

| | | |
|---|---|---|
| 4,536,949 A * | 8/1985 | Takayama et al. |
| 5,880,019 A | 3/1999 | Hsieh et al. ............... 438/666 |
| 5,904,570 A | 5/1999 | Chen et al. ............... 438/725 |
| 6,100,118 A | 8/2000 | Shih et al. ............... 438/132 |
| 6,107,202 A | 8/2000 | Chin et al. ............... 438/690 |
| 6,121,073 A | 9/2000 | Huang et al. ............... 438/132 |
| 6,399,472 B1 * | 6/2002 | Suzuki et al. |

* cited by examiner

*Primary Examiner*—Long Pham
(74) *Attorney, Agent, or Firm*—George O. Saile; Stephen B. Ackerman

(57) ABSTRACT

A process for creating a fuse structure opening in a stack of materials comprised with overlying dielectric layers, and comprised with an underlying polysilicon layer, to expose a conductive fuse structure, has been developed. The process initiates with a dry etching procedure used to create an initial fuse structure opening in the dielectric layers, using a photoresist shape as an etch mask. Subsequent removal of the photoresist shape results in the completion of the fuse structure opening via in situ etching of the polysilicon layer exposed in the initial fuse structure opening. The isotropic wet etch procedure used for photoresist removal and in situ patterning of polysilicon, avoids polysilicon spacer formation on the sides of the conductive fuse structure, which would have been present with the use of an all dry etch procedure. In addition the wet etch procedure selectively terminates on a thin silicon oxide layer, located on the underlying conductive fuse structure.

20 Claims, 2 Drawing Sheets

METHOD OF ETCHING A POLYSILICON LAYER DURING THE STRIPPING OF THE PHOTORESIST SHAPE USED AS AN ETCH MASK TO CREATE AN OPENING TO AN UNDERLYING FUSE STRUCTURE

BACKGROUND OF THE INVENTION (1) Field of the Invention

The present invention relates to methods used to fabricate semiconductor devices, and more specifically to a method used to define an opening in a stack of layers, to expose a fuse structure, located between rows of memory or logic cells.

(2) Description of Prior Art

As the density of cell designs, such as dynamic random access memory (DRAM), or static random access memory (SRAM), increase, rows or arrays of these specific cells are comprised with billions of discrete devices. However a single device failure, located in the high density cell, can result in an unusable memory chip. Therefore to allow the desired yield for chips comprised with high density cells to be realized, redundant, or additional rows of memory devices or cells, are formed on the chip, and then used if needed, to replace a defective row, thus resulting in a useable, high density chip. Rows of devices or cells, are physically connected to the main memory array via a fuse structure, which if broken can either delete a defective row, or add a redundant row, to the main array body. The fuse structure, comprised of a conductive material such as doped polysilicon or polycide (metal silicide—polysilicon), is usually formed from the same layer used to form the gate structure of the metal oxide semiconductor field effect transistor (MOSFET), discrete devices, used for the memory array cells. Therefore to access the fuse structure at the conclusion of device processing, for laser deleting, an opening (fuse opening), through many interlevel dielectric (ILD), layers, and intermetal dielectric (IMD) layers has to be defined.

The process for the fuse structure opening entails etching through many insulator layers, as well as etching through polysilicon layers, in the presence of a photoresist shape, used as an etch mask for definition of the fuse structure opening. Several problems have occurred during this complex etching procedure, one of which is the etching of a polysilicon layer used for interconnect and resistor purposes, covered by an inter-polysilicon oxide (IPO), layer, which in turn overlays the conductive fuse structure. The topography presented by the underlying conductive fuse structure, in combination with an anisotropic component of the fuse structure opening procedure, can result in unwanted polysilicon spacers on the sides of the IPO covered conductive plug structure. Additional over etching to remove the polysilicon spacers can damage the IPO layer overlying the defined fuse structure. This invention will describe a novel procedure for definition of the fuse structure opening, featuring isotropic removal of the polysilicon layer, performed in situ with the removal of the photoresist shape, used as an etch mask for definition of the fuse structure opening. Prior art, such as Huang et al, in U.S. Pat. No. 6,121,073, describe a method for creating a fuse structure opening, in a series of insulator layers, and in a polysilicon layer, however that prior art does not describe the novel in situ etching of a polysilicon layer, during the stripping procedure used to remove the photoresist shape used to define the fuse structure opening.

SUMMARY OF THE INVENTION

It is an object of this invention to form a fuse structure opening in stack of materials comprised of dielectric layers, and of a polysilicon layer, to expose an underlying conductive fuse structure.

It is another object of this invention to use an anisotropic dry etching procedure to form the fuse structure opening in the dielectric layers, while using a isotropic wet procedure to form the fuse structure opening in the polysilicon layer.

It is still another object of this invention to perform the isotropic wet etching component of the fuse structure opening procedure, used for etching of the polysilicon layer, in situ with the procedure used for removal of the fuse structure opening, photoresist shape.

In accordance with the present invention a method of forming a fuse structure opening, featuring a dry etching procedure for defining the fuse structure opening in dielectric layers, and an isotropic wet etch procedure for defining the fuse structure opening in a polysilicon layer, with the isotropic wet etch procedure performed in situ with the procedure used to remove the fuse structure opening, photoresist shape, is described. A photoresist shape, is formed on the top surface of a stack of materials comprising: dielectric layers; a polysilicon layer; an interlevel-poly oxide (IPO), layer; and a conductive fuse structure. A dry etching procedure is used to create a top portion of the fuse structure opening, in the dielectric layers, exposed in an opening in the photoresist shape, with the dry etching procedure terminating on the polysilicon layer. An isotropic wet etch procedure is next used to define the fuse structure opening in the polysilicon layer, with the isotropic wet etch procedure in situ removing the fuse structure opening, photoresist shape. The isotropic wet etching procedure results in exposure of the conductive structure, overlaid with the thin IPO layer.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
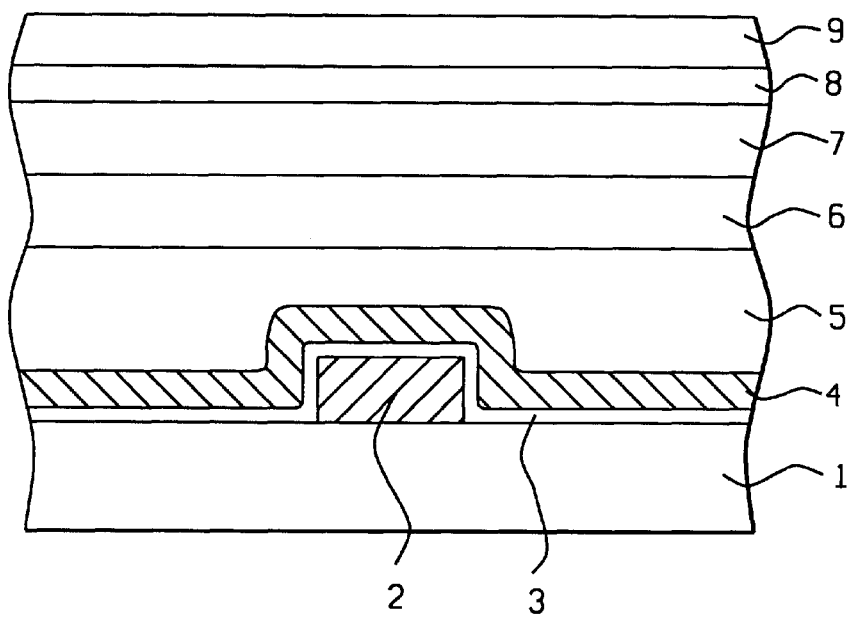
FIGS. 1–3, which schematically, in cross-sectional style, describe the key stages of fabrication used to form a fuse structure opening in a stack of materials, and featuring an isotropic wet procedure used to open a polysilicon layer component of the stack of materials, while in situ removing the photoresist shape used for definition of the fuse structure opening.

The method of forming a fuse structure in a stack of materials comprised of dielectric layers, and of a polysilicon layer, and featuring an isotropic wet procedure to define the fuse structure opening in the polysilicon layer, while in situ removing the photoresist shape used for definition of the fuse structure opening, will now be described in detail. Conductive fuse structure 2, shown schematically in FIG. 1, can be comprised of a conductive material such as doped polysilicon, or polycide, with the polycide in turn comprised of a metal silicide layer, such as tungsten silicide, on polysilicon. Conductive fuse structure 2, is usually formed form the identical materials used for gate structures of the MOSFET devices, with the definition of conductive fuse structure 2, simultaneously defined with the MOSFET gate structures. Conductive fuse structure 2, however is located on insulator layer 1, which can be silicon oxide from an insulator filled shallow trench isolation region, or silicon dioxide from a thermally grown field oxide isolation region. Conductive fuse structure 2, at a thickness between about 150 to 400 Angstroms is physically connected to adjacent memory array rows so that a laser procedure used to "blow" the fuse, will either delete a defective memory array row, or connect or add a redundant memory array row, to a main body of arrays. The connection of the fuse structure to these adjacent array rows is not shown in the drawings. Subsequent device fabrication procedures result in the exposure of conductive fuse structure 2, to an oxidation procedure, resulting in oxidation of a top portion of conductive fuse structure 2, forming IPO layer 3, at a thickness between about 250 to 450 Angstroms. A doped polysilicon layer 4, is then deposited, to be used as a level of interconnection, such as bit lines for DRAM and SRAM designs. Doped polysilicon layer 4, is deposited using low pressure chemical vapor deposition (LPCVD), procedures, to a thickness between about 2000 to 3500 Angstroms, and doped in situ, during deposition via the addition of arsine or phosphine, to a silane ambient. The LPCVD procedure results in conformal coverage of polysilicon layer 4, even on the sides of IPO covered, conductive fuse structure 2. This is schematically shown in FIG. 1.

Interlevel dielectric (ILD), layer 5, is deposited after patterning of polysilicon layer 4, defining a bit line, or interconnect level, is comprised of either silicon oxide, or boro-phoshosilicate glass (BPSG), via LPCVD or via a plasma enhanced chemical vapor deposition (PECVD), procedure, at a thickness between about 5000 to 10000 Angstroms. A chemical mechanical polishing (CMP), procedure is employed to create a smooth top surface topography for ILD layer 5. Inter-metal dielectric (IMD) layer 6, at a thickness between about 9000 to 13000 Angstroms, and IMD layer 7, at a thickness between about 9000 to 13000 Angstroms, again comprised of either silicon oxide or BPSG, are obtained via PECVD procedures. IMD layer 6, is deposited after definition of a first metal interconnect structure which is located on ILD layer 5, and located contacting an underlying bit line structure. IMD layer 7, is deposited after definition of a second metal interconnect structure, which in turn is located on the top surface of IMD layer 6, while contacting an underlying first metal interconnect structure. The metal interconnect structures are not shown in the drawings. Finally a composite insulator layer is deposited, comprised of underlying silicon oxide layer 8, obtained via PECVD procedures at a thickness between about 1500 to 2500 Angstroms, and comprised overlying silicon nitride layer 9, obtained via PECVD procedures, at a thickness between about 6000 to 8000 Angstroms, is deposited. The result of these depositions is schematically shown in FIG. 1.

Figure 2:
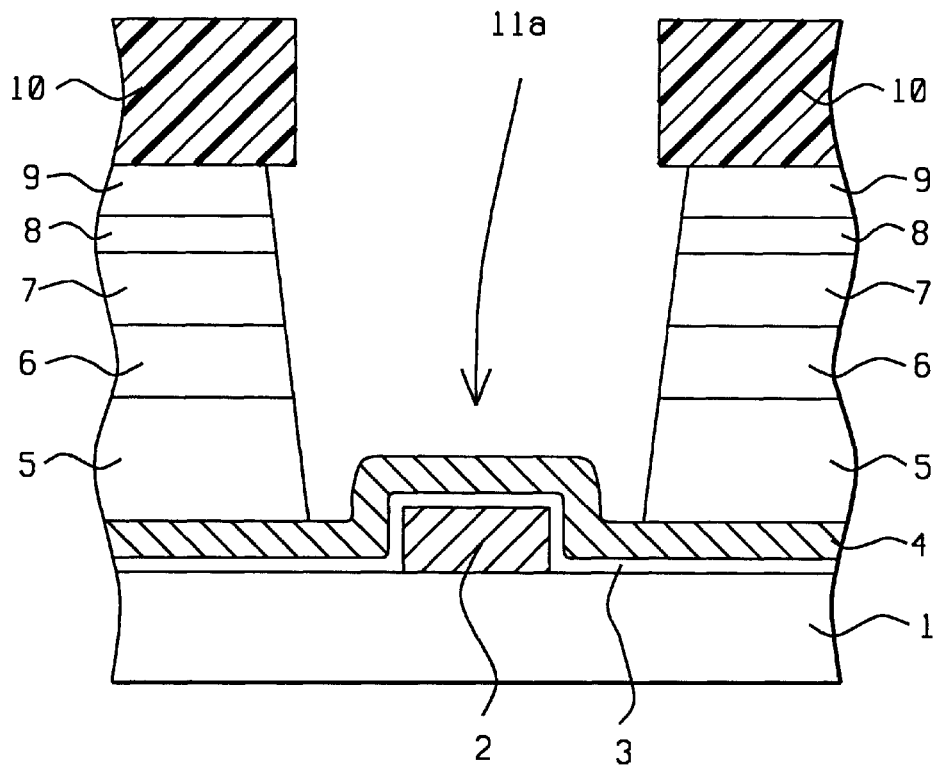
Figure 3:
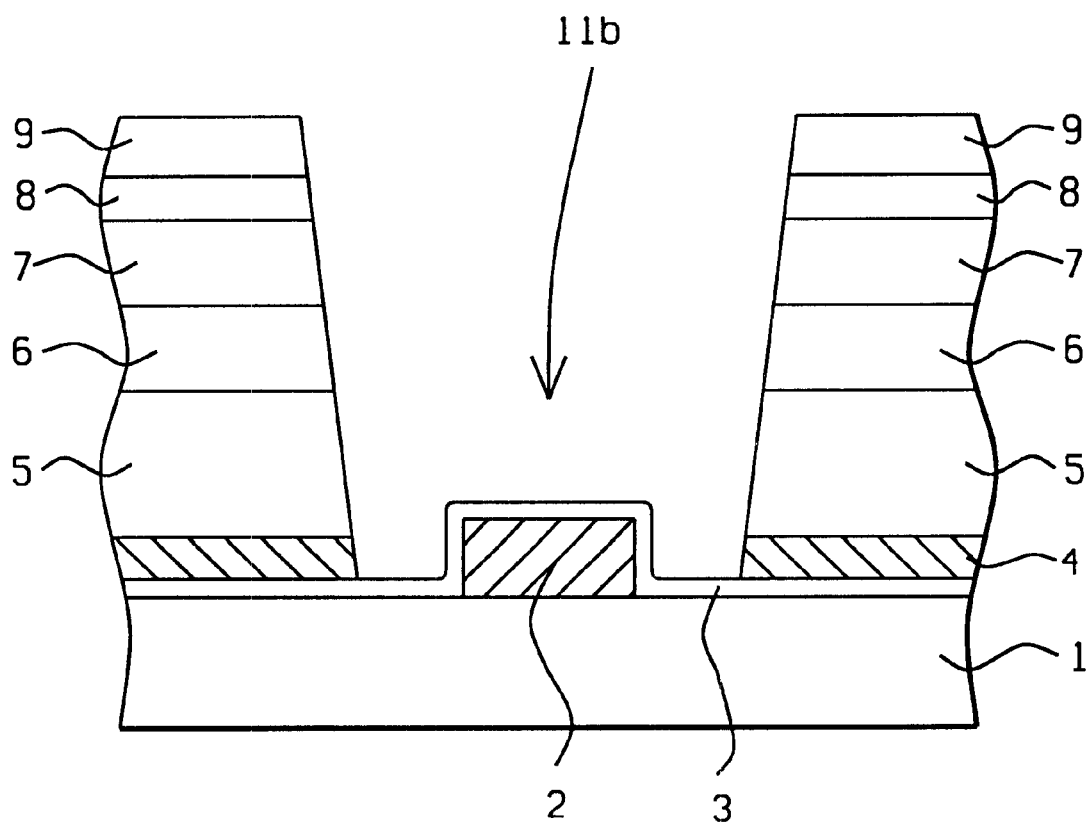

The creation of the fuse structure opening is next addressed and schematically illustrated using FIGS. 2–3. A photoresist shape 10, to be used as an etch mask during a first stage of the fuse structure opening procedure, is formed on the top surface of silicon nitride layer 9, with an opening in photoresist shape 10, exposing the portion of dielectric layers to be removed during the first stage of the fuse structure opening procedure. An anisotropic dry etching procedure, such as a RIE procedure, is used to create a first fuse structure opening 11a. This is accomplished using either $CF_4$ or $CHF_3$ as an etchant for silicon nitride layer 9, silicon oxide layer 8, IMD layer 7, IMD layer 6, and ILD layer 5. This selective dry etching procedure, terminating at the top surface of polysilicon layer 4, results in first fuse structure opening 11a, schematically shown in FIG. 2. The depth of first fuse structure opening 11a, results in a slight taper, and a slight undercut of photoresist shape 10. Several reasons exist for not continuing the dry etching procedure, through polysilicon layer 4, exposing conductive fuse structure 2, overlaid by IPO layer 3. First, the dry etching tools used for IMD as well as ILD layers can contain metal ions obtained from previous patterning of interconnect metal structures, and therefore it is not advisable to transfer metal ion contaminants to a region near the MOSFET devices. Secondly however, and of greater importance would be unwanted polysilicon spacers, or rails, formed on the sides of the IPO covered, conductive fuse structure 2. The polysilicon spacer, created during an anisotropic dry etching of polysilicon layer 4, using $Cl_2$ as an etchant, formed as a consequence of the topography of conductive fuse structure 2, would require a long dry overetch cycle, which in turn could lead to etching of IPO layer 3, and the deleterious etching of exposed, underlying conductive fuse structure 2. Therefore the first stage of the fuse structure opening procedure is terminated at the appearance of polysilicon layer 4, to be followed by a second stage of the fuse structure opening procedure.

A second stage of the fuse structure opening procedure is next addressed and schematically illustrated using FIG. 3. To prevent the formation of polysilicon spacers on the sides of the IPO covered conductive fuse structure, the second stage of the fuse structure opening procedure in polysilicon layer 4, will be performed using a selective, and isotropic, wet etch procedure. The etching of polysilicon layer 4, is accomplished in situ, with the removal of photoresist shape 10. These procedures are performed using a photoresist strip (PRS), process comprised with a stripper such as ACT, and a solvent such as Native Oxide Etchant (NOE), or N-methyl-2-pyrrolidone (NMP). The PRS procedure is comprised of strip procedure, performed at a temperature between about 100 to 120° C., followed by a solvent procedure, performed at a temperature between about 20 to 30° C. The strip procedure is performed using ACT, comprised of DMSO (dimethyl sulfoxide), and MEA (monothanolamine), with the addition of inhibitors, surfactants, and chelating agents, while the subsequent solvent procedure is performed using either NOE or NMP. The PRS process, performed at a temperature between about 100 to 120° C., etches polysilicon at a rate between about 800 to 1200 Angstroms/min, while silicon oxide is not etched in the PRS chemistry. The removal rate of photoresist in the PRS chemistry is greater than 1000 Angstroms/min. Therefore the exposure of first fuse structure opening 11a, to the chemistry of the PRS process, results in isotropic removal of the exposed portion of polysilicon layer 4, with the removal procedure terminating at the top surface of IPO layer 3. During the removal of exposed portions of polysilicon layer 4, photoresist shape 10, is also in situ removed. Even if the removal rate of photoresist shape 10, is greater than the removal rate of polysilicon, the defined pattern in insulator 9, which is not removable in the PRS chemistry, will offer the desired masking properties to create final fuse structure opening 11b, schematically shown in FIG. 3. The ability to etch polysilicon isotropically, during the second stage of the fuse structure opening, prevented the formation of unwanted polysilicon spacers, which would have been formed if polysilicon layer 4, were etched using an anisotropic dry etch procedure. The ability to remove the photoresist shape, while in situ patterning polysilicon, using a isotropic procedure, allows exposure of the IPO covered, conductive fuse structure 2, in final fuse structure opening 11b, to be realized.

While this invention has been particularly shown and described with reference to, the preferred embodiments thereof, it will be understood by those skilled in the art that various changes in form and details may be made without departing from the spirit and scope of this invention.

What is claimed is:

1. A method of forming a fuse structure opening in a stack of materials, on a semiconductor substrate, to expose a fuse structure element, comprising the steps of:

providing said fuse structure element;

forming a thin silicon oxide layer on said fuse structure element;

forming said stack of materials on said thin silicon oxide layer, with said stack of materials comprised of an underlying polysilicon layer, and comprised of overlying dielectric layers;

forming a photoresist shape on the top surface of an dielectric layer, with an opening in said photoresist shape exposing a portion of the top surface of said dielectric layer;

performing a dry etch procedure to form a first fuse structure opening in a portion of said overlying dielectric layers, exposed in said opening in said photoresist shape, with said first fuse structure opening exposing a portion of a top surface of said polysilicon layer; and performing a wet etch procedure to remove said photoresist shape, and to in situ remove said portion of said polysilicon layer exposed in said first fuse structure opening, with said wet etch procedure selectively terminating at the top surface of said thin silicon oxide layer, resulting in a final fuse structure opening featuring said fuse structure element, covered by said thin silicon oxide layer, exposed at bottom of said final fuse structure opening.

2. The method of claim 1, wherein said fuse structure element is formed from either a doped polysilicon layer, or from a polycide, (metal silicide—polysilicon), layer, at a thickness between about 150 to 400 Angstroms.

3. The method of claim 1, wherein said thin silicon oxide layer is a polysilicon oxide layer, obtained via thermal oxidation procedures to a thickness between about 250 to 450 Angstroms.

4. The method of claim 1, wherein said polysilicon layer is a doped polysilicon layer, obtained via LPCVD procedures to a thickness between about 2000 to 3500 Angstroms, and doped in situ during deposition via the addition of arsine, or phosphine, to a silane ambient.

5. The method of claim 1, wherein said dielectric layers are comprised of: an underlying interlevel dielectric (ILD), layer of silicon oxide or BPSG, at a thickness between about 5000 to 10000 Angstroms; a first intermetal dielectric (IMD), layer of silicon oxide or BPSG, at a thickness between about 9000 to 13000 Angstroms; an overlying second IMD layer of silicon oxide or BPSG, at a thickness between about 9000 to 13000 Angstroms; and an overlying composite insulator layer comprised of a silicon oxide layer, at a thickness between about 1500 to 2500 Angstroms, underlying a silicon nitride layer, at a thickness between about 6000 to 8000 Angstroms.

6. The method of claim 1, wherein said first fuse structure opening is formed in said dielectric layers via a dry etching procedure, using $CF_4$ or $CHF_3$ as an etchant for said dielectric layers.

7. The method of claim 1, wherein said wet etch procedure used to remove said photoresist shape, and to in situ pattern said polysilicon layer creating said final fuse structure opening, is accomplished using a photoresist strip (PRS), process, comprised of a stripper such as ACT, comprised of DMSO (dimethyl sulfoxide), and MEA (monothanolamine), at a temperature between about 100 to 120° C., and using a solvent such as NOE, or NMP (N-methyl-2-pyrrolidine), at a temperature between about 20 to 30° C.

8. The method of claim 1, wherein the etch rate of said polysilicon layer, using a PRS process is between about 800 to 1200 Angstroms/min, while said thin silicon oxide layer is not etched in the PRS process.

9. A method of forming a fuse structure opening, in a stack of materials on a semiconductor substrate, to expose a fuse structure element, featuring the formation of said fuse structure opening in a polysilicon layer, performed in situ with removal of a photoresist shape used for definition of said fuse structure opening, comprising the steps of:

forming a fuse structure element;

forming a thin silicon oxide layer on said fuse structure element;

depositing a doped polysilicon layer;

depositing an interlevel dielectric (ILD), layer on said doped polysilicon layer;

planarizing said ILD layer;

depositing a first intermetal dielectric (IMD), layer on said planarized ILD layer;

depositing a second IMD layer;

depositing a composite insulator layer on said second IMD layer;

forming said photoresist shape on said composite insulator layer, with an opening in said photoresist shape exposing a portion of top surface of said composite insulator layer;

performing an anisotropic dry etch procedure to remove portions of said composite insulator layer, portions of said second IMD layer, portions of said first IMD layer, and portions of said ILD layer, exposed in said opening in said photoresist shape, creating a first fuse structure opening, with said dry etch procedure selectively terminating on said doped polysilicon layer; and performing an isotropic wet etch procedure to remove said photoresist shape from top surface of said composite insulator layer, and to in situ create opening in said doped polysilicon layer, with said isotropic wet etch procedure selectively terminating at the top surface of said thin silicon oxide layer, resulting in the formation of a final fuse structure opening, exposing conductive plug structure, overlaid with said thin silicon oxide layer, located at bottom of said final fuse structure opening.

10. The method of claim 9, wherein said fuse structure element is formed from a doped polysilicon layer, at a thickness between about 150 to 450 Angstroms.

11. The method of claim 9, wherein said thin silicon oxide layer is a polysilicon oxide layer, obtained via thermal oxidation procedures to a thickness between about 250 to 450 Angstroms.

12. The method of claim 9, wherein said doped polysilicon layer is obtained via LPCVD procedures to a thickness between about 2000 to 3500 Angstroms, and doped in situ during deposition via the addition of arsine, or phosphine, to a silane ambient.

13. The method of claim 9, wherein said interlevel dielectric (ILD), layer is comprised of silicon oxide or borophosphosilicate glass (BPSG), obtained via LPCVD or PECVD procedures, at a thickness between about 5000 to 10000 Angstroms.

14. The method of claim 9, wherein said ILD layer is planarized via a chemical mechanical polishing procedure.

15. The method of claim 9, wherein said first intermetal dielectric (IMD), layer is comprised of silicon oxide or boro-phosphosilicate glass (BPSG), obtained via PECVD procedures, at a thickness between about 9000 to 13000 Angstroms.

16. The method of claim 9, wherein said second IMD layer is comprised of silicon oxide or boro-phosphosilicate glass (BPSG), obtained via PECVD procedures, at a thickness between about 9000 to 13000 Angstroms.

17. The method of claim 9, wherein said composite insulator layer is comprised of an underlying silicon oxide layer, obtained via PECVD procedures at a thickness between about 1500 to 2500 Angstroms, and comprised of an overlying silicon nitride layer, obtained via PECVD procedures at a thickness between about 6000 to 8000 Angstroms.

18. The method of claim 9, wherein said anisotropic dry etch procedure, used to form said first fuse structure opening in said composite insulator layer, in said second IMD layer, in said first IMD layer, and in said planarized ILD layer, is a reactive ion etch procedure, performed using $CHF_3$ of $CF_4$ as an etchant.

19. The method of claim 9, wherein said isotropic wet etch procedure used to remove said photoresist shape, and to in situ pattern said doped polysilicon layer, creating said final fuse structure opening, is accomplished using a photoresist strip (PRS), process, comprised of a stripper such as ACT, ((dimethyl sulfoxide), and MEA (monothanolamine), at a temperature between about 100 to 120° C., and comprised of solvent such as NOE, or (N-methyl-2-pyrrolidine (NMP), at a temperature between about 20 to 30° C.

20. The method of claim 9, wherein the etch rate of said polysilicon layer, using said isotropic wet etch process, is between about 800 to 1200 Angstroms/min, while said thin silicon oxide layer is not etched in during said isotropic wet etch process.

* * * * *